United States Patent [19]
Seaborne

[11] Patent Number: 4,950,857
[45] Date of Patent: Aug. 21, 1990

[54] SOLID STATE CERAMIC MICROWAVE HEATING SUSCEPTOR COMPOSITIONS WITH METAL SALT MODERATORS

[75] Inventor: Jonathan Seaborne, Corcoran, Minn.

[73] Assignee: General Mills, Inc., Minneapolis, Minn.

[21] Appl. No.: 274,179

[22] Filed: Nov. 21, 1988

Related U.S. Application Data

[60] Division of Ser. No. 110,246, Oct. 19, 1987, and a continuation-in-part of Ser. No. 56,201, Jun. 1, 1987.

[51] Int. Cl.$^5$ .............................................. H05B 6/80
[52] U.S. Cl. ....................... 219/10.55 E; 219/10.55 F; 99/DIG. 14
[58] Field of Search .................. 219/10.55 E, 10.55 F, 219/10.55 M; 99/DIG. 14

[56] References Cited

U.S. PATENT DOCUMENTS

| | | | |
|---|---|---|---|
| 2,582,174 | 1/1952 | Spencer | 99/221 |
| 2,830,162 | 4/1958 | Copson et al. | 219/10.41 |
| 3,585,258 | 6/1971 | Levinson | 264/26 |
| 3,591,751 | 7/1971 | Goltsos | 219/10.55 E |
| 3,705,054 | 12/1972 | Matsushita et al. | 117/124 A |
| 3,783,220 | 1/1974 | Tanizaki | 219/10.55 E |
| 3,853,612 | 10/1974 | Spanoudis | 117/212 |
| 3,857,009 | 12/1974 | MacMaster et al. | 219/10.55 E |
| 3,922,452 | 11/1975 | Forker, Jr. et al. | 428/35 |
| 3,946,187 | 3/1976 | MacMaster et al. | 219/10.55 E |
| 3,946,188 | 3/1976 | Derby | 219/10.55 E |
| 4,003,840 | 1/1977 | Ishino et al. | 252/62 |
| 4,190,757 | 2/1980 | Turpin et al. | 219/10.55 E |
| 4,219,361 | 8/1980 | Sutton et al. | 219/10.41 |
| 4,230,924 | 10/1980 | Brastad et al. | 219/10.55 E |
| 4,266,108 | 5/1981 | Anderson et al. | 219/10.55 E |
| 4,267,420 | 5/1981 | Brastad | 219/10.55 E |
| 4,283,427 | 8/1981 | Winters et al. | 219/10.55 E |
| 4,341,872 | 7/1982 | MacDowell | 501/6 |
| 4,590,349 | 5/1986 | Brown et al. | 219/10.55 E |
| 4,592,914 | 6/1986 | Kuchenbecker | 426/107 |
| 4,594,492 | 6/1986 | Maroszek | 219/10.55 E |
| 4,661,299 | 4/1987 | Thorsrud | 264/25 |
| 4,825,024 | 4/1989 | Seaborne | 219/10.55 E |

OTHER PUBLICATIONS

"Controlled Microwave Heating and Melting of Gels" by Roy et al., J. Am. Ceram. Soc 68(7) 392–95 (1985).
"Microwave Heating of Neptheline Glass Ceramics" by J. MacDowell, Ceramic Bulletin, vol. 63, No. 2 (1984).

Primary Examiner—Roy N. Envall, Jr.
Attorney, Agent, or Firm—John A. O'Toole

[57] ABSTRACT

Disclosed are improved ceramic compositions which are useful in the formulation and fabrication of microwave susceptors for disposable packages for the microwave heating of food items and to such articles themselves. The compositions include certain metal salts as time/temperature profile moderators in addition to novel microwave absorbing materials and a binder. Certain metal salts can be used to dampen or lower the final temperatures reached upon microwave heating the ceramic compositions. Other metal salts can be used to increase or accelerate the final temperatures reached upon microwave heating. The microwave absorbing materials comprise ceramics with neutral lattice charges such as clays, talc, kaolin, silicates, aluminosilicates, sodium metasilicate, alumina and mixtures thereof. The compositions provide good heat generation and a predeterminable upper temperature limit. The materials are common and inexpensive.

14 Claims, 7 Drawing Sheets

SOLID STATE CERAMIC MICROWAVE HEATING SUSCEPTOR COMPOSITIONS WITH METAL SALT MODERATORS

CROSS REFERENCE TO RELATED APPLICATIONS

This is a division of application Ser. No. 110,247, filed Oct. 19, 1987, now U.S. Pat. No. 4,825,024, which a continuation in part application to USSN 056,201, filed June 1, 1987 now U.S. Pat. No. 4,810,845 entitled SOLID STATE CERAMIC MICROWAVE HEATING SUSCEPTOR COMPOSITIONS.

BACKGROUND OF THE INVENTION

1. The Technical Field

This invention relates generally to the art of the microwave heating by high frequency electromagnetic radiation or microwave energy. More particularly, the present invention relates to ceramic compositions useful for fabrication in or into microwave heating susceptors, especially for disposable microwave packages for food products.

2. Background Art

The heating of food articles with microwave energy by consumers has now become commonplace. Such microwave heating provides the advantages of speed and convenience. However, heating breaded food with microwaves often gives them a soggy texture and fails to impart the desirable browning flavor and/or crispness of conventionally oven heated products due in part to retention of oil and moisture. Unfortunately, if microwave heating is continued in an attempt to obtain a crisp exterior, the interior is generally overheated or overdone. Moreover, the microwave fields in the ovens are uneven which can lead to unevenness or both hot and cold spots within food items or packaged food items being heated.

The prior art includes many attempts to overcome such disadvantages while attempting to retain the advantages of microwave heating. That is, the prior art includes attempts at providing browning or searing means in addition to microwave heating. Basically, three approaches exist whether employing permanent dishes or disposable packages to providing microwave heating elements which provide such browning or searing and which elements are referred to herein and sometimes in the art as microwave heating susceptors. In the art, materials which are microwave absorptive are referred to as "lossy" while materials which are not are referred to as "non-lossy" or, equivalently, merely "transparent."

The first approach is to include an electrically resistive film usually quite thin, e.g., 0.00001 to 0.00002 cm., applied to the surface of a non-conductor or non-lossy substrate. In the case of a permanent dish, the container is frequently ceramic while for a disposable package the substrate can be a polyester film. Heat is produced because of the $I^2R$ or resistive loss (see for example, U.S. Pat. Nos. 3,853,612, 3,705,054, 3,922,452 and 3,783,220). Examples of disposable packaging materials include metallized films such as described in U.S. Pat. Nos. 4,594,492, 4,592,914, 4,590,349, 4,267,420 and 4,230,924.

A second category of microwave absorbing materials comprise electric conductors such as parallel rods, cups or strips which function to produce an intense fringing electric field pattern that causes surface heating in an adjacent food. Examples include U.S. Pat. Nos. 2,540,036, 3,271,552, 3,591,751, 3,857,009, 3,946,187 and 3,946,188. Such an approach is only taken with reusable utensils or dishes.

A third approach is to form articles from a mass or bed of particles that become hot in bulk when exposed to microwave energy. The microwave absorbing substance can be composed of ferrites, carbon particles, etc. Examples of such compositions or articles prepared therefrom include, for example, U.S. Pat. Nos. 2,582,174, 2,830,162 and 4,190,757.

A review of the prior art, especially that art directed towards provision of heating susceptors for disposable packages for microwave heating of foods indicates at least three basic problems exist in the formulation and fabrication of heating susceptors. One difficulty with the third category of materials, generally, is that they can exhibit runaway heating, that is, upon further microwave heating their temperature continues to increase. Great care must be taken in fabrication of safe articles containing such materials. Metallized film materials of the first category can be formulated and fabricated such that they do not exhibit runaway heating. However, such films suffer from the second problem; namely that while their operating temperatures are quite hot, are at controlled temperature, and are sufficient to brown the surface of nearby food items, due to their thinness and little mass, only small quantities of heat are actually generated. Such materials are thus unsuitable for certain foods which require absorption of great amounts of heat in their preparation e.g., cake batters. The third general problem is one of cost. Microwave susceptors frequently comprise costly materials. Also, fabrication of susceptor structures frequently is complex and expensive.

Accordingly, in view of the above-noted problems with present microwave susceptors, an object of the present invention is to provide a device which will heat under the influence of the microwave radiation up to an upper temperature limit at which temperatures the device comes to a steady state absorption of the microwave energy and heating to a higher temperature is precluded.

Another object of the present invention is to provide a heating device which is disposable and adapted for use with pre-prepared foods.

A still further object of the present invention is to provide a heating device which can be utilized as a nondisposable utensil.

A still further object of the present invention is to provide a heating device which by appropriate selection of manufacturing parameters can provide a predetermined upper temperature limit and moderate microwave heating of the food item through absorption and moderation of the microwave energy.

Another object of the present invention is to provide a heating device which is inexpensive to manufacture, safe to use and well adapted for its intended use.

Surprisingly, the above objectives can be realized and new compositions provided which overcome the problems associated with previous materials which have been used for the fabrication of microwave heating susceptors. The present compositions do not exhibit runaway heating yet generate relatively large amounts of heat. Indeed, the final heating temperature can be controlled quite closely. Also, the present compositions are comprised of materials which are commonly available and inexpensive. In the most surprising aspect of the present invention, the compositions comprise ceramic materials previously considered alone to be microwave transparent.

Throughout the specification and claims, percentages are by weight and temperatures in degrees Fahrenheit, unless otherwise indicated.

SUMMARY OF THE INVENTION

The present invention provides compositions useful in the formulation and fabrication of microwave heating susceptors. The present compositions essentially comprise an active microwave absorbing material, a metal salt temperature profile moderator and a binder. In its article aspect, the present invention provides new and improved microwave heat susceptors especially for packaged food items, to packages for such items and to the packaged food items themselves.

The present microwave absorbing materials are common ceramic materials having a neutral lattice charge. The microwave absorbing materials can comprise from about 0.1% to 98% of the ceramic compositions.

The binder essentially comprises from about 2.0% to 99.9% of the compositions. Conventional binder materials are suitable for use herein.

Useful metal salts for temperature profile modulators include sodium chloride, magnesium chloride, sodium sulfate, zinc sulfate, calcium chloride, calcium oxide, lithium hydroxide, ammonium chloride, sodium hydroxide, potassium hydroxide, sodium bicarbonate, potassium bicarbonate, potassium bromate, ferric chloride, sodium chromate, lithium hypochlorite, sodium hypochlorite, potassium hypochlorite, titanium dioxide (rutile and anatase), sodium oxalate, ferrous ammonium sulfate, boron suboxide, sodium metaborate and the like. The metal salts comprise from about 0.1% to 10% of the ceramic compositions.

In its article aspect, the present invention resides in devices fabricated from the present compositions. Such devices are microwave heating susceptors generally in sheet form and which range in thickness from about 0.5 to 8.0 mm. The susceptors find particular usefulness in disposable packages for the microwave heating of food.

In other article aspects, the present invention provides packages comprising the present novel microwave susceptors and to packaged food items.

In its method aspect, the invention resides in novel heating methods including subjecting the compositions to a microwave field while in contact with food items.

DETAILED DESCRIPTION OF THE INVENTION

The present invention relates to compositions useful for fabrication into heating susceptors such as are useful for disposable packages for the microwave heating of food products. The compositions comprise a defined microwave absorbing material and a binder. In its article aspect, the present invention resides in microwave heating susceptors for packaged food items, to packages for such items and to the packaged food items themselves. The present compounds are an improvement in the ceramic compositions described in co-pending, parent application entitled "Solid State Ceramic Microwave Heating Susceptor Compositions" (filed June 1, 1987 by J. Seaborne as USSN 056,201, Attorney Docket 4445) and which is incorporated herein by reference. The compositions there described essentially comprise a defined microwave absorbing material and a binder. Preferred compositions are described as additionally comprising common salt.

In the present invention, it has been surprisingly discovered that other metal salts can be used as temperature profile accelerators in addition to sodium chloride. Thus, ceramic compositions with improved or higher temperatures can be obtained through the addition of modest amounts of certain metal salts. Additionally, it has also been surprisingly discovered that certain other metal salts are useful for providing the converse benefit; namely, can be used to provide ceramic compositions with dampened or lowered temperature heating profiles. Collectively, the present dampeners, accelerators and super accelerators can be used alone and in various combinations to control and to modulate the heating profile characteristics of microwave ceramic compositions.

In the ceramic industry, a distinction is made between "greenware," a ceramic composition before firing or vitrification, and the finished, fired or vitrified ceramic compositions prepared therefrom. The firing step profoundly changes a large number of properties of the ceramic composition's properties as the individual constituents are fused into a homogeneous mass. Broadly speaking, the present invention is directed toward compositions which would be considered greenware in the ceramic arts.

Certain of the microwave active materials have been used in greenware ceramic compositions, but generally at markedly different concentrations and for different purposes than in the present invention. For example, kaolin reduces plasticity and tends to make the greenware mix short or lean. Likewise, alumina has a similar effect on the plasticity and will reduce green strength. Also, sodium metasilicate is not used at levels greater than 1% since greater amounts cause sticking and hinder mold release properties as well as decrease green strength.

The present materials and their other general properties are well known and are described generally, for example, in "An Introduction to the Rock Forming Materials," by Deer, Howie, and Zussman, Longman Group Ltd., Essex, England, 1966, or in "The Potter's Dictionary of Materials and Techniques" by Frank and Janet Hamer, Watson-Guptill Publications (1986), each of which is incorporated herein by reference. Materials as therein described are generally and conventionally classified as ortho and ring silicates, chain silicates, sheet silicates, framework silicates and nonsilicates. However, the materials useful herein can fall into any of these classifications although not all materials in those classifications are useful herein.

As indicated above, the microwave absorbing materials useful herein surprisingly include a wide variety of ceramic materials previously regarded as microwave transparent. It is speculated herein that these materials have heretofore been unappreciated as being useful as consumer microwave absorbing materials since most investigations of their electromagnetic interactions, i.e., absorption/transparency have been done at very different frequencies or have been investigated as fired ceramics. By ceramic materials are meant materials comprising oxygen attached to non-carbonaceous elements, and primarily to magnesium, calcium, iron, aluminum, silicon and mixtures thereof. The present materials are further essentially characterized by a neutral lattice charge. "Neutral lattice charge" is used herein in its conventional usage and means that the net relative electron surface charge densities of the material is essentially zero or that the cation exchange capability is essentially zero for the constituent chemical make-up of the ceramic material. The present ceramic materials are further characterized by relatively low electrical resistivity, i.e., about 0.1 to 35 ohm.cm and are thus classifiable as semiconductors in the broad sense of the term.

Exemplary specific microwave absorptive materials include:

Sodium Metasilicate, $Na_2SiO_3$;

Talc, $Mg_3[Si_4O_{10}](OH)_2$;

Kaolin, $Al_4.[Si_4O_{10}](OH)_8.4H_2O$;

Alumina and activated alumina, $Al_2O_3$;

Clays (fine grained, natural, early argillareous materials);

Aluminosilicates; non-siliceous ceramics.

Of course, mixtures of these materials can also be used. Preferred materials include sodium aluminum silicate, sodium metasilicate, clays and kaolin and mixtures thereof due to the relatively flat or uniformity of their final heating temperature.

The present compositions include an effective amount of the above described microwave absorbing materials. The precise level will depend on a variety of factors including end use application, desired final temperature, and thickness of the susceptor to be fabricated from the present compositions. Good results are generally obtained when the microwave absorbing material comprises from about 0.1% to about 98% by weight of the present ceramic compositions. Preferred compounds include from about 20% to 98% by weight of the microwave absorbing material. For best results, the ceramic compositions comprise about 40% to 98% by weight of the microwave absorbing materials. The particle size of the microwave absorption material or refactory is not critical. However, finely ground materials are preferred inasmuch as the ceramic susceptors produced therefrom are smooth and uniform in texture.

Another essential component of the present ceramic compositions is a conventional ceramic binder. By the term "ceramic binder" is meant that the binder is capable of binding the present ceramic heating materials into a solid mass. The term is not meant to imply or require that the binder material itself is necessarily ceramic in composition although it well may be. Such ceramic binders are well known in the ceramic art and the skilled artisan will have no problem selecting suitable binder materials for use herein. The function of the binder is to form the particulate microwave absorbing material into a solid form or mass. Exemplary materials include both ceramic and plastic binders, respectively, such as cement, plaster of Paris, i.e., calcium sulphate, silica fiber, feldspar, pulverized Kelvar ® (a polyamide fiber), colloidal silicas, fumed silicas, fiberglass, wood pulp, cotton fibers, and mixtures thereof. The binder can comprise from about 2% to 99.9% by weight of the present ceramic compounds, preferably from about 20% to 80%. Exemplary, conventional plastic based binders, both thermoplastic and thermosetting, are described in U.S. Pat. Nos. 4,003,840 (issued Jan. 18, 1977 to Ishino et al.) which is incorporated herein by reference.

In one preferred embodiment, the present compositions include binders which are organic thermoplastic resins especially those approved as food packaging material such as polyvinyl chloride, polyethylene, polyamides, polyesters, polycarbonates, polyimides, epoxies, etc. In these embodiments, the thermoplastic resin binders can range from as little as 20% up to 60% of the composition and preferably about 30% to 50%. Such compositions are especially well suited for fabrication into shaped microwave susceptors, especially food trays, e.g., for TV dinners or entrees.

The present ceramic compositions additionally essentially comprise a temperature profile modulator. Three subclasses of temperature profile moderators exist: (1) dampeners, (2) accelerators or enhancers, and (3) super accelerators. Accelerators, for example, may increase the temperature rate of increase with time when exposed to microwave heating. Accelerators may also increase the maximum obtainable temperature. Dampeners have the opposite affect while super accelerators exhibit a greater acceleration effect.

Exemplary useful dampeners are selected from the group consisting of MgO, CaO, $B_2O_3$, Group 1A alkali metal (Li, Na, K, Cs, etc.) compounds of chlorates ($LiClO_3$, etc.), metaborates ($LiBO_2$, etc.), bromides (LiBr, etc.) benzoates ($LiCO_2C_6H_5$, etc.), dichromates ($Li_2Cr_2O_7$, etc.), also; all calcium salts, antimony chloride, ammonium chloride, cupric chloride, copper (II) sulfate (blue vitriol), magnesium chloride, zinc sulfate, Tin (II) chloride, vanadyl sulfate, chromium chloride, cesium chloride, cobalt chloride, nickel ammonium chloride, titanium dioxide (rutile and anatase), and mixtures thereof. Exemplary useful accelerators are selected from the group consisting of Group 1A alkali metal (Li, Na, K, Cs, etc.) compounds of chlorides (LiCl, etc.), nitrites ($LiNO_2$, etc.), nitrates ($LiNO_3$, etc.), iodides (LiI, etc.), bromates ($LiBrO_3$, etc.), fluorides (LiF, etc.), carbonates ($Li_2CO_3$, etc.), phosphates ($Li_3PO_4$, etc.) sulfites ($Li_2SO_3$, etc.), sulfides (LiS, etc.), hypophosphites ($LiH_2PO_2$, etc.), also barium chloride, ferric chloride, sodium borate, magnesium sulfate, strontium chloride, ammonium hydroxide, Tin(IV) chloride, titanium (II) oxide, titanium (III) oxide, silver citrate and mixtures thereof. Exemplary useful super accelerators are desirably selected from the group consisting of $B_4C$ (boron carbide), $ReO_3$ (rhenium (IV) oxide), Cuprous chloride, ferrous ammonium sulfate, silver nitrate, Group 1A alkali metal (Li, Na, K, Cs, etc.) compounds of hydroxides (LiOH, etc.), hypochlorites (LiOCl, etc.), hypophosphates ($Li_2H_2P_2O_6$, $Na_4P_2O_6$, etc.), bicarbonates ($LiHCO_3$, etc.), acetates ($LiC_2H_3O_2$, etc.), oxalates ($Li_2C_2O_4$, etc.), citrates ($Li_3C_6H_5O_7$, etc.), chromate ($Li_2CrO_4$, etc.), and sulfates ($Li_2SO_4$, etc.), and mixtures thereof. Exemplary useful herein as accelerators are certain highly ionic metal salts of sodium, lithium, magnesium, silver, barium, potassium, copper, iron, and titanium including, for example, sodium chloride, sodium sulfate, silver nitrate, silver citrate, sodium bicarbonate, potassium bicarbonate, magnesium sulfate, sodium citrate, potassium acetate, barium chloride, potassium iodide, potassium bromate, copper (I) chloride, lithium chloride and ferric chloride. The most preferred accelerator useful herein is common salt due to its low cost and availability. The temperature profile accelerator(s) can assist in reaching more quickly the final operating temperature of the ceramic composition. Also, the accelerator(s) increases modestly the final operating temperature of the ceramic composition.

The preferred ceramic compositions comprise from about 0.01% to about 10% by weight of the metal salt moderators. Preferably, the present compounds comprise from about 0.1% to 6% of the moderator. For best results about 1% to 6% moderator is used.

While ceramic compositions can be formulated having higher amounts of these metal salt moderators, no advantage is derived therefrom. It is also believed important that the temperature profile moderators exist in an ionized form in order to be functional. Thus, ceramic compositions beneficially containing these salts should contain some moisture at some point in the composition preparation.

The present ceramic compositions can be fabricated into useful microwave heating susceptor articles by a simple admixture of the materials into a homogeneous blend, and addition of sufficient amounts of water if needed to hydrate the binder. When plaster of Paris is used as the binder, typically, water will be added in a weight ratio to binder ranging from about 0.4 to 0.7:1. While the wet mixture is still soft, the ceramic compositions can be fabricated into desirable shapes, sizes and thicknesses and thereafter allowed to harden or dry to a moisture content ranging from about 2.5% to 10%. Another common fabrication technique is referred to as compression molding. In compression molding a damp mix, e.g., 3% to 10% moisture of water activated binders, are employed, or a dry mix if not, is placed into a mold and subjected to compression to effect a densification of the composition to form a firm body. Still another useful fabrication technique is isostatic pressing which is similar to compression molding but with one side of the mold being flexible. Isostatic pressing is especially useful in forming curved ceramic pieces.

The final heating temperature of the present compositions is mildly influenced by the thickness of the susceptor elements fabricated. Good results are obtained when susceptor thickness ranges from about 0.5 to 8 mm in thickness, both when using the present improved compositions and when using the previously described ceramic compositions without the temperature profile moderators. Preferred susceptors have thicknesses ranging from 0.7 to 4 mm. All manner of shapes and size heating susceptors can be fabricated although thin flat tiles are preferred in some applications.

Of course, one advantage of the present invention is that upon heating in a conventional microwave oven, e.g., 2450 MHz, the ceramic compositions will relatively quickly (e.g., within 30 to 300 seconds) heat to a final temperature ranging from about 300° to 600° F. which temperature range is very desirable in providing crisping and browning to foods adjacent thereto and consistent with safe operation of the microwave oven.

Another advantage of the present ceramic compositions is that they can be dried at temperatures above 180° F. (82° C.). Still another advantage of the present invention is that susceptors fabricated from the present ceramic compositions provide a microwave field modulating effect, i.e., evening out peaks and nodes, i.e., standing wave points and, it is believed independent of wattage. This benefit is especially useful when sensitive foods such as cookie doughs or protein systems are being microwave heated.

Still another advantage of the present ceramic compositions is that they are believed to be useful not only with microwave ovens operating at 2450 MHz but at all microwave frequencies, i.e., above as low as 300 MHz.

Another advantage of the present invention is that the ceramic compositions can absorb oil and/or moisture from food items to be microwave heated, e.g., par-fried fish portions, without substantial adverse affect on heating performance.

It is important that the susceptors fabricated herein be unvitrified, i.e., not subjected to a conventional firing operation generally above 800° F. to 1000° F. (426° C. to 538° C). Conventional firing can result in a fused ceramic composition substantially transparent to microwave and thus devoid of the desirable microwave reactive properties of the present invention.

The present ceramic compositions are useful in any number of microwave absorption applications. The present ceramic compositions are particularly useful for fabrication into microwave susceptors which in turn are useful as components in packages for foods to be heated with microwaves.

In certain preferred embodiments, the ceramic compositions additionally essentially include reinforcing fibers or fabric reinforcing. The fibers provide additional strength and resistance from crumbling and breakage. Suitable fibers (natural or synthetic) (whether plate-like or rods) are characterized by possessing high aspect ratios (the ratio of the fibers width to its length) and in the case of fabric reinforcing are either nonwoven, woven or of the cord variety. The fibers essentially comprise from about 0.5% to 20%, preferably about 1.0% to 5% of the ceramic compositions.

Another advantage is that the ceramic susceptor can be coated with plastics or inorganic coatings to render the surface non-absorptive to moisture and oil as well as providing a non-stick surface. Also, colorants, both organic and inorganic in nature may be incorporated at appropriate levels into either the coating or body of the ceramic susceptor to aid in aesthetics without adversely affecting the performance of the ceramic susceptor.

Figures 1, 2, 3:
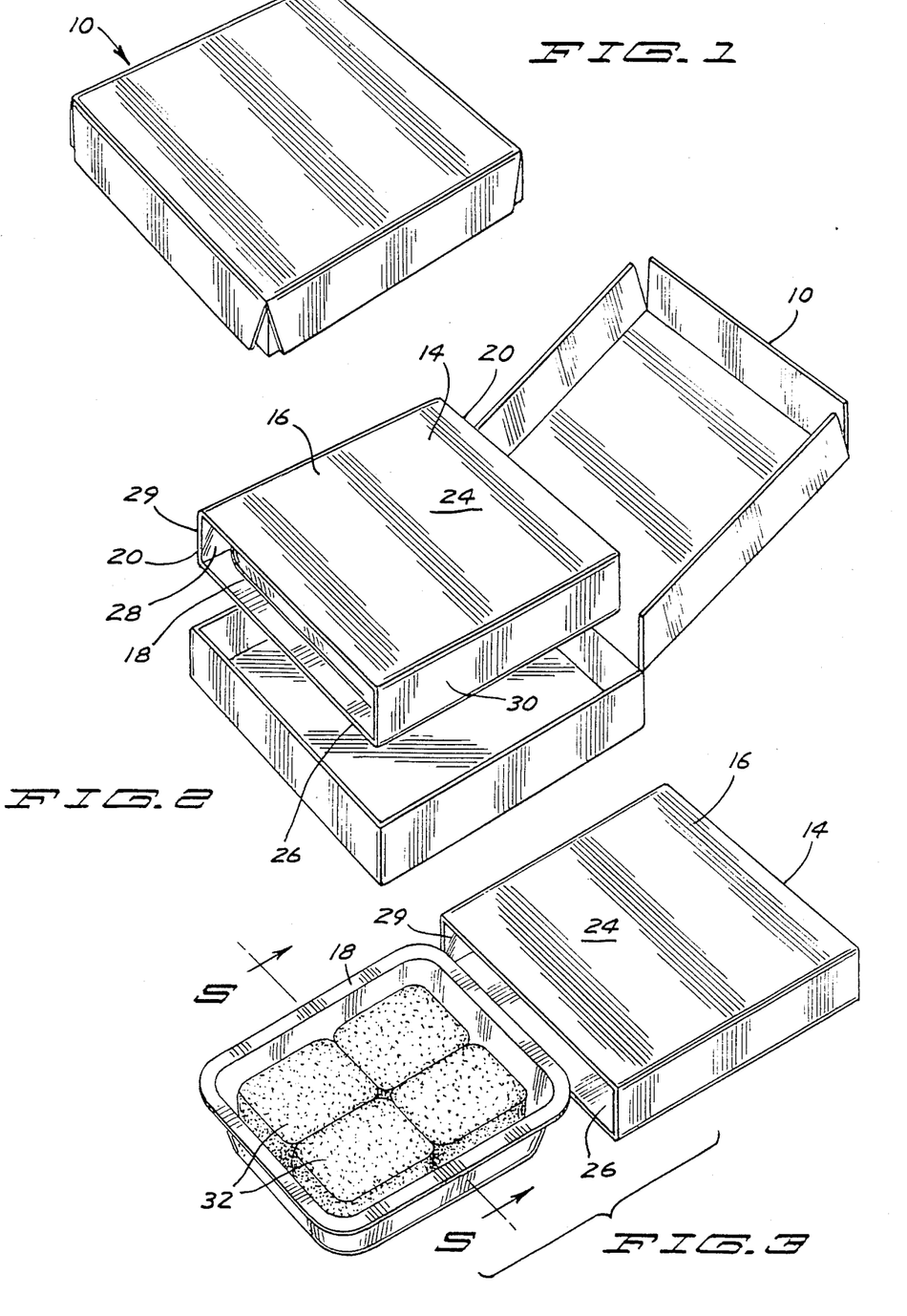
FIG. 1 is a perspective view of a packaged food article for microwave heating constructed in accordance with the teachings of the invention.
FIG. 2 is a perspective view of the packaged food article with outer paperboard outerwrap opened and with an inner tray and sleeve shown disengaged.
FIG. 3 is a perspective view of the tray disengaged from the sleeve and holding several food pieces.

For example, FIG. 1 illustrates generally a packaged food item 10 fabricated in accordance with the teachings of the present invention and suitable for microwave heating. FIG. 2 shows that the article 10 can optionally comprise a six-sided outerwrap 12 which can be plastic, paper or other conventional packaging material such as the paperboard package depicted. The article can further comprise an inner assembly 14 disposed within the outerwrap 12 which can comprise a sleeve 16 fabricated from a dielectric material (e.g., cardboard, paper, polyester) and disposed therein a tray 18. In conventional use, the consumer will open the article 12, remove and discard the overwrap 12, and insert the entire assembly into the microwave oven. The sleeve 16 is helpful although not essential not only to prevent splattering in the microwave oven, but also to assist in securing the food items against excessive movement during distribution.

Figure 4:
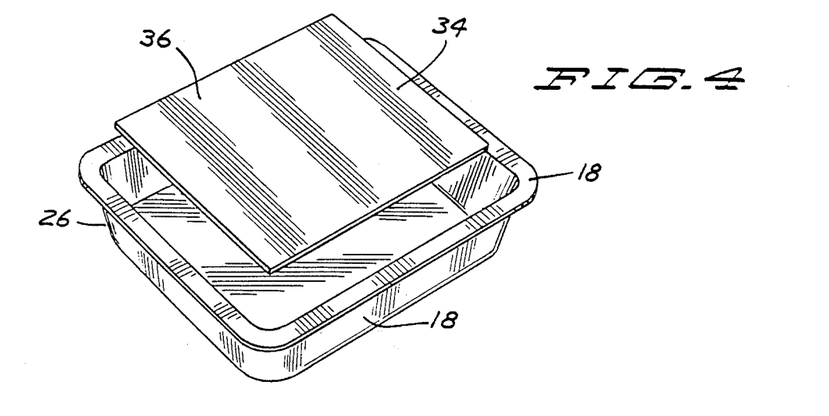
FIG. 4 is a perspective view of the tray with the food items removed showing a microwave heating susceptor raised above its resting position in the tray.

In FIG. 2, it can be seen that the sleeve 16 can comprise an opposed pair of open ends, 20 and 22, an upper major surface or top wall 24, a lower major surface or bottom wall 26 and an opposed pair of minor side or wall surfaces 28 and 30. As can be seen in FIG. 3, the tray 18 holds or contains one or more food items 32. FIG. 4 shows the tray 18 with the food items 32 removed. Disposed within the tray 18 is one or more microwave heating susceptors such as microwave susceptor heating panel 34. In this preferred embodiment, the susceptors are generally flat or planar and range in thickness from 0.020 to 0.250 inch.

Still referring to FIGS. 3 and 4, with the cooking of certain foods, it may be desirable to heat the food items 32 from only or primarily one side by use of the heating susceptor panel 34 while at the same time minimizing the heating of the food item 32 by exposing it to microwave radiation through the walls of the package assembly 14. To allow microwave radiation to reach the susceptor 34, the bottom wall 26 is microwave transparent at least to the extent that sufficient microwave energy can enter the package to heat the susceptor 34. Side walls 28 and 30 can each optionally be shielded with shielding 29 as can top wall 24 thereby restricting the entry of microwave radiation through these walls to the food product as is known in the art. The shielding 29 can be of any suitable type material of which aluminum foil is a currently preferred material. With the use of shielding, the microwave radiation penetrates the microwave transparent bottom 26 only. Accordingly, cooking of the food product 32 in this embodiment is accomplished substantially totally by the heat transferred to the food product 32 from the susceptor 34 although some microwave entry through the open ends 20 and 22 occurs. It is pointed out that the terms microwave transparent and microwave shield are relative terms as used herein and in the appended claims.

Figure 5:
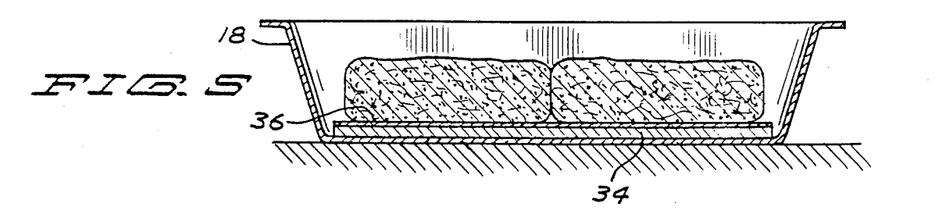
FIG. 5 is a cross sectional view of the tray taken in the direction of lines 5—5 of FIG. 3.

In FIG. 5, it can be seen that the heating panel 34 can optionally comprise a thin finish layer 36, e.g., 0.00005 to 0.003 inch (0.001 to 0.025 mm) to impart desirable surface properties, e.g., color, water repellency, smooth appearance, stick free, etc. In the simplest form, such a layer can comprise ordinary paraffin or a sodium silicate polymerized with zinc oxide. The finish layer does not substantially adversely affect the performance of the microwave susceptor. Such surface property modification finds particular usefulness when the microwave susceptors are used in medical settings. For example, it is known to fabricate surgical implants, e.g., discs, cylinders, from ferrites which absorb microwave radiation to thermally treat tumors. In such applications wherein the present compositions are employed, water repellency may be particularly desirable.

Other types of packages can be utilized with the ceramic microwave heater compositions of the present invention. It is an important advantage that the present compositions can be fabricated into susceptors of different configurations whether regular, e.g., corrugated, or irregular.

Figure 6:
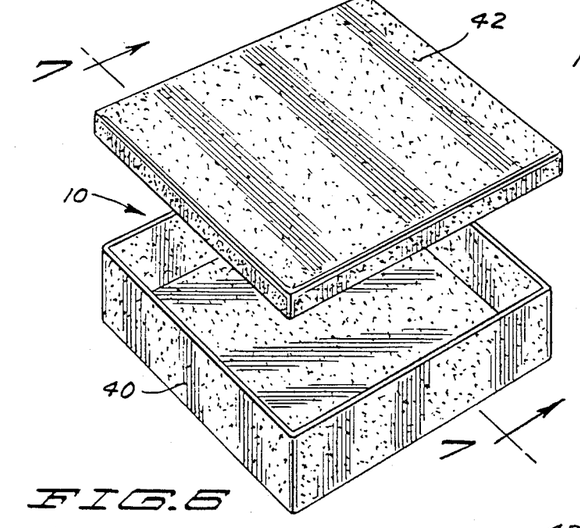
FIG. 6 is a perspective view of an alternate tray with a lid each fabricated from the present compositions with food items removed.
Figure 7:
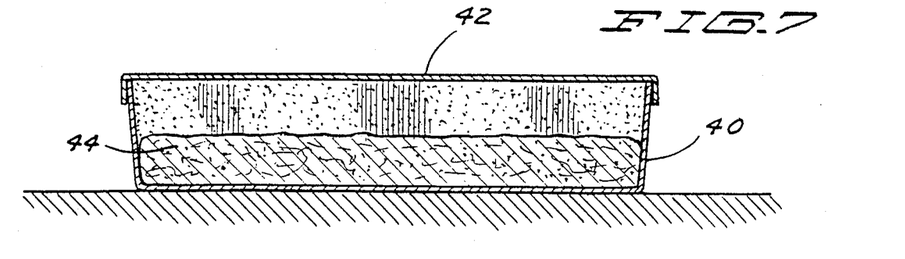
FIG. 7 is a perspective view of the alternate tray taken in the direction of lines 7—7 of FIG. 6.

Another embodiment is depicted in FIG. 6. Thermoplastic resins are preferred for use as the binder materials. In this embodiment, the article 10 in addition to outerwrap 12 as shown in FIG. 2 can comprise a microwave heating susceptor 40 fabricated into trays, dishes or shallow pans whether square, rectangular, circular, oval, etc. which serve both to contain and heat the food items. Such tray shaped susceptors 40 find particular suitability for use in connection with a batter type food item 44, especially cake batters or with casseroles, baked beans, scalloped potatoes, etc. In one particular embodiment the tray 40 can additionally include a cover 42 also fabricated from the present ceramic compositions. Trays 40 with covers 42 are especially useful for batter food items like brownies in which it is desired to form an upper or top skin to the food item 44.

Figure 5A:
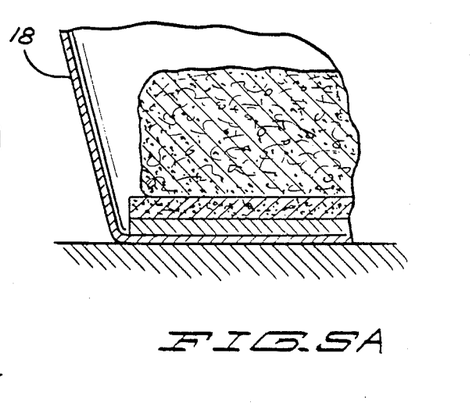

In still another embodiment shown in FIG. 5A, the panel susceptor 34 can additionally comprise a backing layer(s), especially a metal foil, e.g., aluminum 46. The foil serves to reflect back to the susceptor 34 microwave energy passing through the susceptor 34. The incorporation of a microwave shielding or reflecting layer 29 in close proximity on the opposite surface of the ceramic susceptor 34 also serves to act as a susceptor temperature booster to elevate the operating temperature substantially above the temperature obtained without a microwave shielding or reflective layer 29. Final temperature reached can be as high as 100° F. or more over similar structures without the metal foil. Also, the use of the temperature booster can reduce the need for a thicker ceramic susceptor to obtain the same temperature thereby reducing both production costs as well as final weights of the microwave package. Since the ceramic compositions adhere to the metal foil with some difficulty and cause an in heating interference due to conductor-wave phenomena interaction, it is preferable to treat the surface of the metal foil with an intermediate or primer layer (not shown) for better adherency, i.e., ordinary primer paints, or to have an intermediate silicone layer, paper layer or other polymer layer, or to select those binders for the ceramic compositions with increased capacity to adhere to metal foils.

The skilled artisan will also appreciate that the present compositions absorb microwave radiation at a wide range of frequencies and not merely at those licensed frequencies for consumer microwave ovens.

Other types of packages can be utilized with the heater of the present invention. It is an advantage that the present compositions can be fabricated into different configurations whether regular, e.g., corrugated, or irregular. The susceptor compounds of the present invention can also be utilized in non-disposable utensils adapted for a limited number of repetitive heating cycles by embedding the heater or otherwise associating the heater with a nondisposable utensil body. The susceptor is associated with the remainder of the utensil in a manner such that the heater will be in heat transfer relation to a product to be heated in or on the utensil. The utensil can be in the form of an open top dish, griddle or the like. However, the present compositions will exhaust their ability to heat upon microwave exposure relatively quickly, i.e., after only a few cycles of operation.

Without further elaboration, it is believed that one skilled in the art can, using the preceding description utilize the present invention to its fullest extent. The following preferred specific embodiments are, therefore, to be construed as merely illustrative and not limitative of the remainder of the disclosure whatsoever. It will be appreciated that other modifications of the present invention, within the skill of those in the food arts, can be undertaken without departing from the spirit and scope of this invention.

EXAMPLE 1

Figure 8:
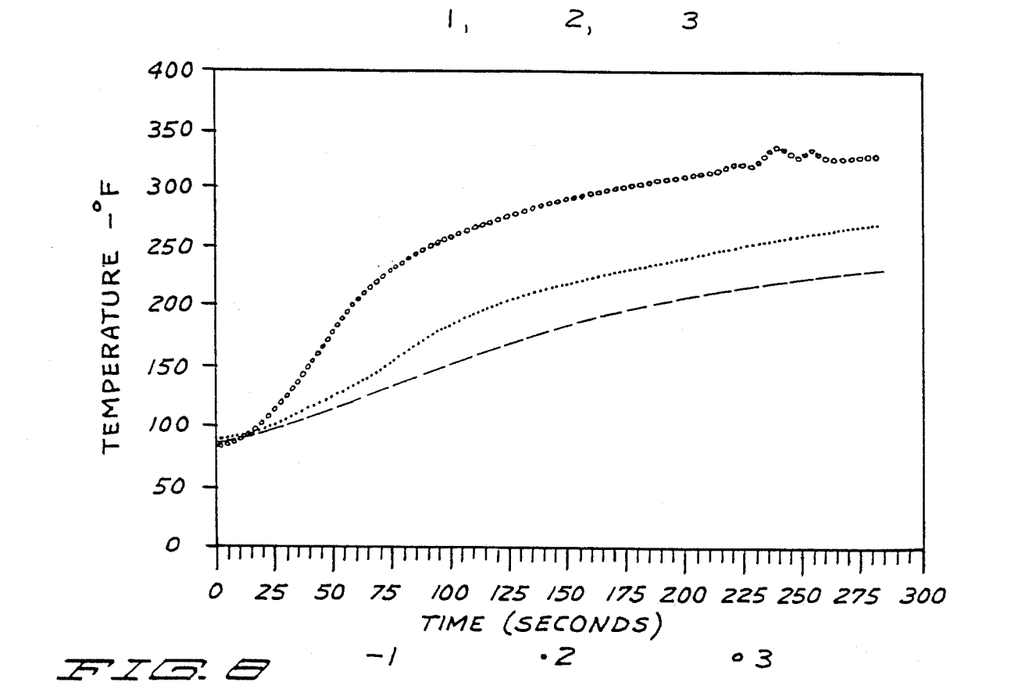
FIGS. 8-17 depict time/temperature response curves for ceramic compositions exemplified in Examples 1-31.

100 grams of calcined activated high alumina X-5111 (Englehard Corporation, Edison, NJ 08818) was dry blended with 40 grams of magnesium silicate (Ceramitalc HDT, R. T. Vanderbilt Company, Inc., Norwalk, CT 06855). 7.5 grams of magnesium chloride M.W. 203.31 was dissolved in 65 grams of distilled water and added to the dry mix. The slurry was cast into 3½ inch square tile frames 0.125 inches thick and a paper backing was bonded to the surface. The composite was dried at 150° F. (65.6° C.) for 3 hours. The resulting tile was stable and exhibited minimal dimensional shrinkage. The structure weight was 28.8 grams, density 1.147 g cm$^{-3}$. The tile was subjected to a 750 watt, 2460 MHz microwave field for a period of five minutes while the temperature of the tile surface was monitored using a Luxtron 750 ® Fluoroptic temperature monitor equipped with ceramic clad fiber optic temperature probes and interfaced with an IBM PC/AT computer for data collection and handling. The recorded and averaged temperature profile of the tile is shown in FIG. 8 as line 1. The metal salt in this example is acting as a dampener on the susceptor.

EXAMPLE 2

Similar to Example 1 except with 7.5 grams of sodium chloride M.W. 58.44 substituted for the 7.5 grams of magnesium chloride. The structure weight was 26.8 grams, density 1.068 g cm$^{-3}$, thickness 0.125 inches. The recorded and averaged temperature of the susceptor during the microwave exposure is shown in FIG. 8 as line 2. The metal salt in this example is acting as an accelerator on the susceptor.

EXAMPLE 3

Similar to Example 1 except with 7.5 grams of sodium sulfate M.W. 142.04 substituted for the 7.5 grams of magnesium chloride. The structure weight was 26.5 grams, density 1.056 g cm$^{-3}$, thickness 0.125 inches. The recorded and averaged temperature of the susceptor during the microwave exposure is shown in FIG. 8 as line 3. The metal salt in this example is acting as a super accelerator on the susceptor.

EXAMPLE 4

Figure 9:
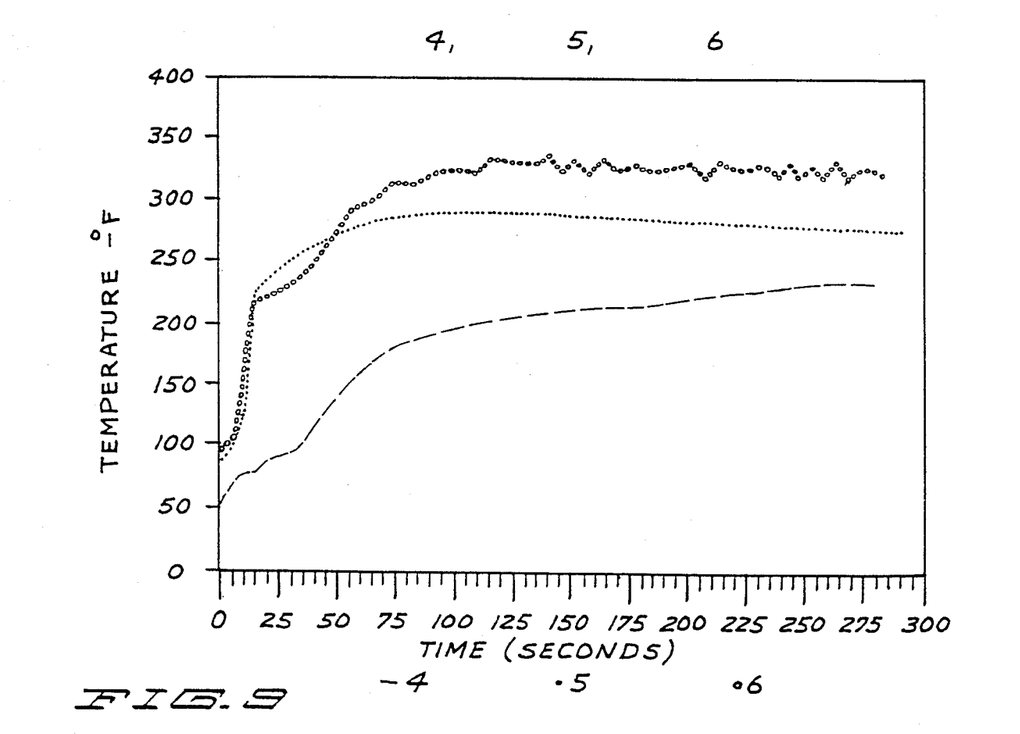

5.0 grams of sodium metasilicate pentahydrate, 30.0 grams calcium sulfate hemihydrate, 10.0 grams of calcined activated high alumina X-5111 (Englehard Corporation), 35.0 grams Kentucky Clay #6 Kentucky-Tennessee Clay Company, Mayfield, KY), 50.0 grams Hexafil--a semi-reinforcing clay (Hammill and Gillespie, Inc., Livingston, NJ) and 7.5 grams of Goldart---Cedar Heights air floated secondary clay (Minnesota Clay, Bloomington, MN) were dry blended together to a uniform consistency. 62 grams of distilled water containing 7.5 grams of magnesium oxide M.W. 40.31 was added to the dry powder mix and a paste formed upon mixing. The paste was cast into 3.5 inch square tiles 0.125 inches thick and a paper backing was bonded to the surface. The composite susceptor was dried for 8 hours at 150° F. (65.6° C.). The resulting tiles were intact and displayed a 23.4% shrinkage upon drying. The susceptor weight was 25.4 grams, density 1.012 g cm$^{-3}$. The recorded and averaged temperature profile of the susceptor is shown in FIG. 9 as line 4. The metal salt in this example is acting as a dampener on the susceptor.

EXAMPLE 5

Similar to Example 4 except with 7.5 grams of sodium chloride M.W. 58.44 substituted for the 7.5 grams of magnesium oxide. The structure weight was 32.6 grams, density 1.298 g cm$^{-3}$, thickness 0.125 inches. The recorded and averaged temperature of the susceptor during the microwave exposure is shown in FIG. 9 as line 5. The metal salt in this example is acting as an accelerator on the susceptor.

EXAMPLE 6

Similar to Example 4 except with 7.5 grams of sodium citrate M.W. 294.1 substituted for the 7.5 grams of magnesium oxide. The structure weight was 31.2 grams, density 1.243 g cm$^{-3}$, thickness 0.125 inches. The recorded and averaged temperature of the susceptor during the microwave exposure is shown in FIG. 9 as line 6. The metal salt in this example is acting as a super accelerator on the susceptor.

EXAMPLE 7

Figure 10:
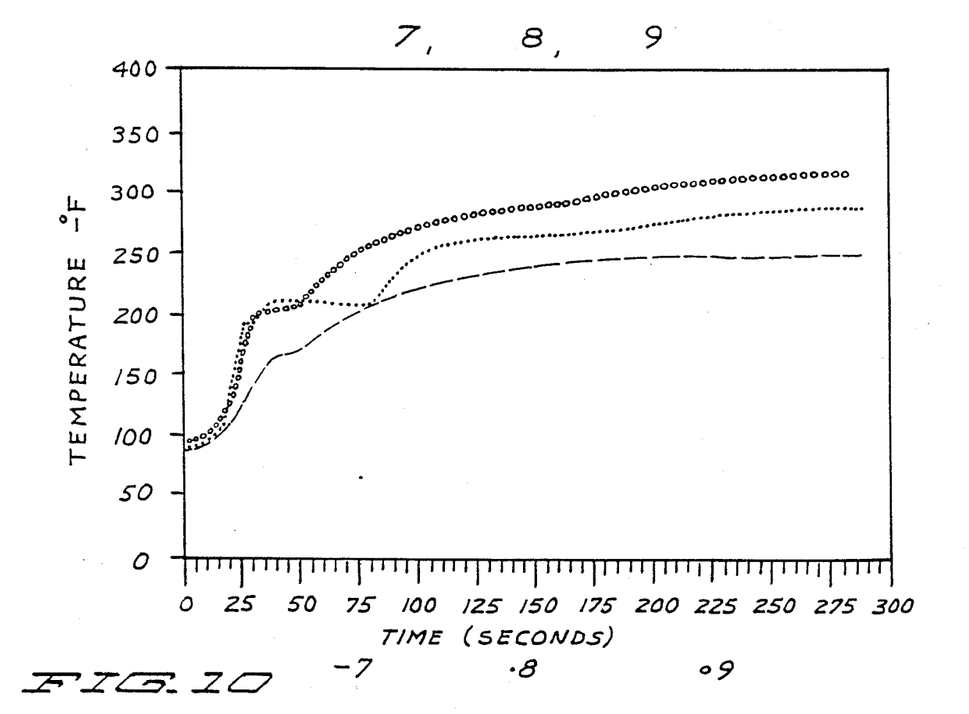

50 grams of sodium metasilicate pentahydrate, 30 grams of calcium sulfate hemihydrate, 10 grams of Hawthorn Bonding Fireclay (Minnesota Clay, Bloomington, MN) and 50 grams of sodium aluminum silicate were dry blended together to a uniform consistency. 70 grams of the dry mix was added with stirring to 35 grams of distilled water containing 7.5 grams of calcium chloride M.W. 110.99 and a paste formed upon mixing. The paste was cast into 3.5 inch square tiles 0.125 inches thick and a paper backing was bonded to the surface. The composite susceptor was dried for 4 hours at 150° F. (65.6° C.). The resulting tiles were intact and displayed less than 2% shrinkage upon drying. The susceptor weight was 29.6 grams, density 1.179 g cm$^{-3}$. The recorded and averaged temperature profile of the susceptor is shown in FIG. 10 as line 7. The metal salt in this example is acting as a dampener on the susceptor.

EXAMPLE 8

Similar to Example 7 except with 7.5 grams of sodium chloride M.W. 58.44 substituted for the 7.5 grams of calcium chloride. The structure weight was 25.5 grams, density 1.016 g cm$^{-3}$, thickness 0.125 inches. The recorded and averaged temperature of the susceptor during the microwave exposure is shown in FIG. 10 as line 8. The metal salt in this example is acting as an accelerator on the susceptor.

EXAMPLE 9

Similar to Example 7 except with 7.5 grams of lithium hydroxide M.W. 41.96 substituted for the 7.5 grams of calcium chloride. The structure weight was 29.4 grams, density 1.171 g cm$^{-3}$, thickness 0.125 inches. The recorded and averaged temperature of the susceptor during the microwave exposure is shown in FIG. 10 as line 9. The metal salt in this example is acting as a super accelerator on the susceptor.

EXAMPLE 10

10 grams of Tennessee Clay #6 (Kentucky-Tennessee Clay Company, Mayfield, KY), 10 grams of Hexafil, 10 grams of calcined activated high alumina X-5111, 10 grams of Hawthorn Bonding Fireclay (Minnesota Clay, Bloomington, MN), 10 grams A. P. Green Fireclay (Minnesota Clay), 10 grams Goldart-Cedar Heights Clay (Minnesota Clay), 10 grams Yellow Banks 401 (Minnesota Clay), Old Hickory Ball Clay (Minnesota Clay), 10 grams NYTAL® Talc (R. T. Vanderbilt Company, Inc., Norwalk, CT 06855), 10 grams of Cornwall Stone (Minnesota Clay), 10 grams Geistley Borate (Minnesota Clay), 20 gram sodium aluminum silicate and 20 grams of Feldspar (Minnesota Clay) were dry blended together to a uniform consistency. 70 grams of distilled water containing 7.5 grams of sodium metaborate M.W. 137.86 was added to the dry powder mix and a paste formed upon mixing. The paste was cast into 3.5 inch square tiles 0.125 inches thick and a paper backing was bonded to the surface. The composite susceptor was dried for 2 hours at 150° F. (65.6° C). The resulting tiles were intact and displayed less than 2% shrinkage upon drying.

Figure 11:
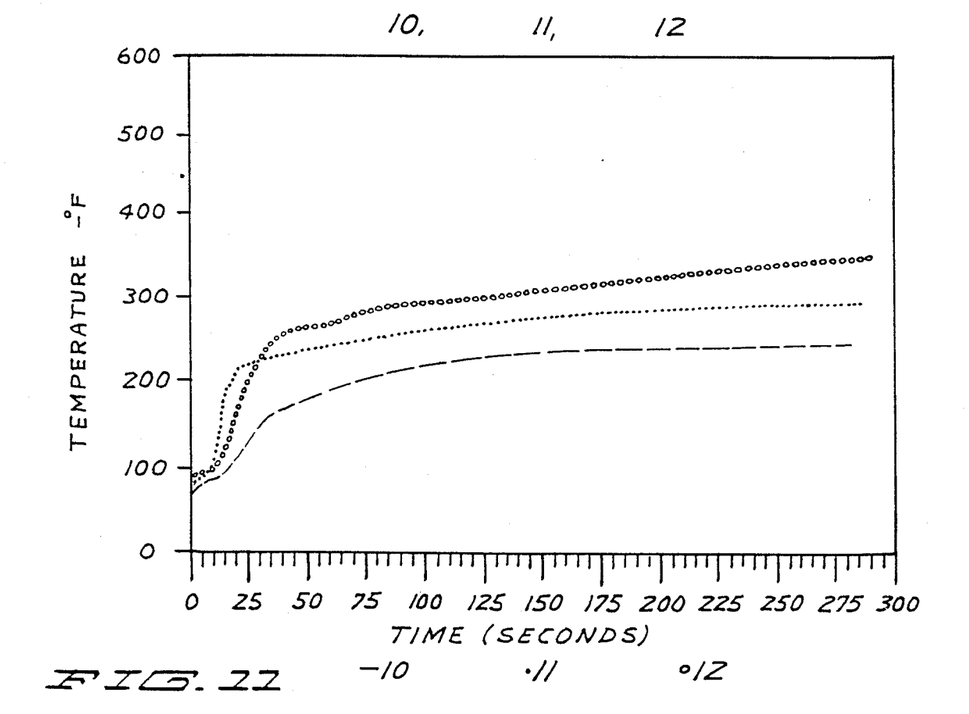

The susceptor weight was 28.8 grams, density 1.147 g cm$^{-3}$. The recorded and averaged temperature profile of the susceptor is shown in FIG. 11 as line 10. The metal salt in this example is acting as a dampener on the susceptor.

EXAMPLE 11

Similar to Example 10 except with 7.5 grams of sodium chloride M.W. 58.44 substituted for the 7.5 grams of sodium metaborate. The structure weight was 32.6 grams, density 1.298 g cm$^{-3}$, thickness 0.125 inches. The recorded and averaged temperature of the susceptor during the microwave exposure is shown in FIG. 11 as line 11. The metal salt in this example is acting as an accelerator on the susceptor.

EXAMPLE 12

Similar to Example 10 except with 7.5 grams of sodium hydrogen carbonate M.W. 84.01 substituted for the 7.5 grams of sodium metaborate. The structure weight was 27.8 grams, density 1.108 g cm$^{-3}$, thickness 0.125 inches. The recorded and averaged temperature of the susceptor during the microwave exposure is shown in FIG. 11 as line 12. The metal salt in this example is acting as a super accelerator on the susceptor.

EXAMPLE 13

Figure 12:
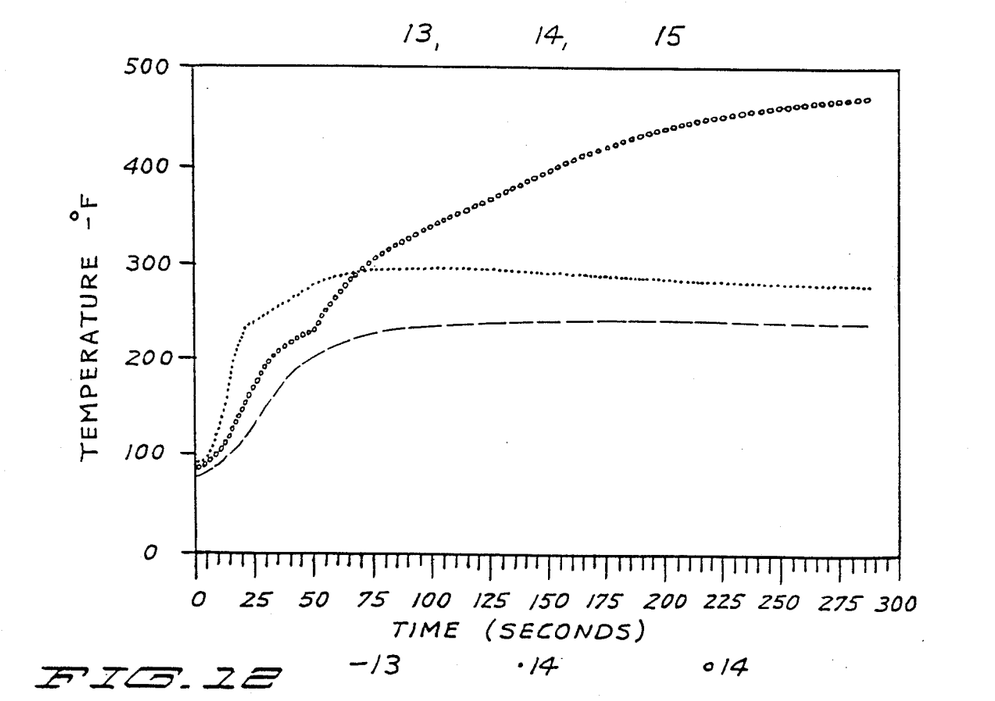

10 grams of Tennessee Clay #6, 30 grams of Hawthorn Bonding Fireclay, 10 grams of A. P. Green Fireclay, 20 grams Goldart-Cedar Heights Clay, 5 grams of Yellow Banks 401, 5 grams Old Hickory Ball Clay, 50 grams of Georgia Kaolin #6 Tile Clay (Georgia-Kaolin, Union, NJ) and 5 grams of Feldspar were dry blended together to a uniform consistency. 70 grams of distilled water containing 7.5 grams of calcium oxide M.W. 56.08 was added to the dry powder mix and a paste formed upon mixing. The paste was cast into 3.5 inch square tiles 0.125 inches thick and a paper backing was bonded to the surface. The composite susceptor was dried for 2 hours at 160° F (71.1° C). The resulting tiles were intact and displayed less than 2% shrinkage upon drying. The susceptor weight was 29.2 grams, density 1.163 g cm$^{-3}$. The recorded and averaged temperature profile of the susceptor is shown in FIG. 12 as line 13. The metal salt in this example is acting as a dampener on the susceptor.

EXAMPLE 14

Similar to Example 13 except with 7.5 grams of sodium chloride M.W. 58.44 substituted for the 7.5 grams of calcium oxide. The structure weight was 33.3 grams, density 1.326 g cm$^{-3}$, thickness 0.125 inches. The recorded and averaged temperature of the susceptor during the microwave exposure is shown in FIG. 12 as line 14. The metal salt in this example is acting as an accelerator on the susceptor.

EXAMPLE 15

Similar to Example 13 except with 7.5 grams of silver nitrate M.W. 169.87 substituted for the 7.5 grams of calcium oxide. The structure weight was 30.6 grams, density 1.219 g cm$^{-3}$, thickness 0.125 inches. The recorded and averaged temperature of the susceptor during the microwave exposure is shown in FIG. 12 as line 15. The metal salt in this example is acting as a super accelerator on the susceptor.

EXAMPLE 16

Figure 13:
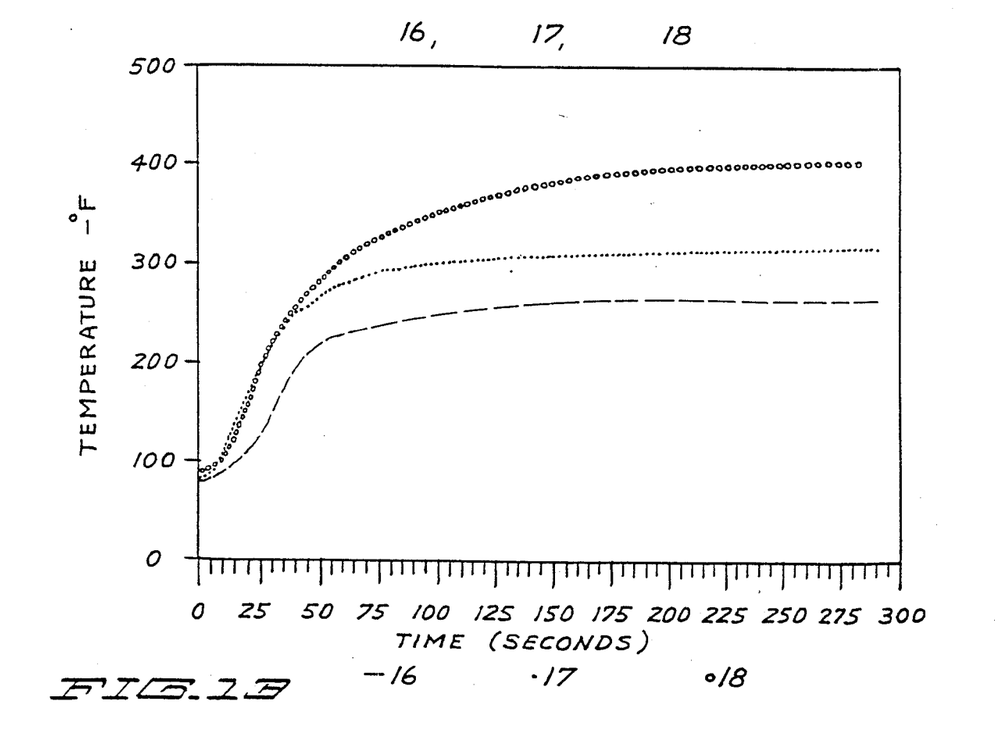

15 grams of calcined activated high alumina X-5111 (Englehard Corporation), 25 grams of Hawthorn Bonding Fireclay, 20 grams of Goldart-Cedar Heights Clay, 10 grams of Yellow Banks 401, 25 grams NYTAL® Talc (R. T. Vanderbilt Company, Inc.), 25 grams of Georgia Kaolin #6 Tile Clay (Georgia-Kaolin) and 15 grams of sodium aluminum silicate were dry blended to a uniform consistency. 70 grams of distilled water containing 7.5 grams of cobalt chloride M.W. 237.93 was added to the blend and a paste formed upon mixing. The paste was cast into 3.5 inch square tiles 0.125 inches thick and a paper backing was bonded to the surface. The composite susceptor was dried for 1 hour at 180° F. (82.2° C.). The resulting tiles were intact and displayed less than 5% shrinkage upon drying. The susceptor weight was 29.6 grams, density 1.179 g cm$^{-3}$. The recorded and averaged temperature profile of the susceptor is shown in FIG. 13 as line 16. The metal salt in this example is acting as a dampener on the susceptor.

EXAMPLE 17

Similar to Example 16 except with 7.5 grams of sodium chloride M.W. 58.44 substituted for the 7.5 grams of cobalt chloride. The structure weight was 30.6 grams, density 1.219 g cm$^{-3}$, thickness 0.125 inches. The recorded and averaged temperature of the susceptor during the microwave exposure is shown in FIG. 13 as line 17. The metal salt in this example is acting as an accelerator on the susceptor.

EXAMPLE 18

Similar to Example 16 except with 7.5 grams of lithium hypochlorite M.W. 58.39 substituted for the 7.5 grams of cobalt chloride. The structure weight was 30.3 density 1.207 g cm$^{-3}$, thickness 0.125 inches. The recorded and averaged temperature of the susceptor during the microwave exposure is shown in FIG. 13 as line 18. The metal salt in this example is acting as a super accelerator on the susceptor.

EXAMPLE 19

Figure 14:
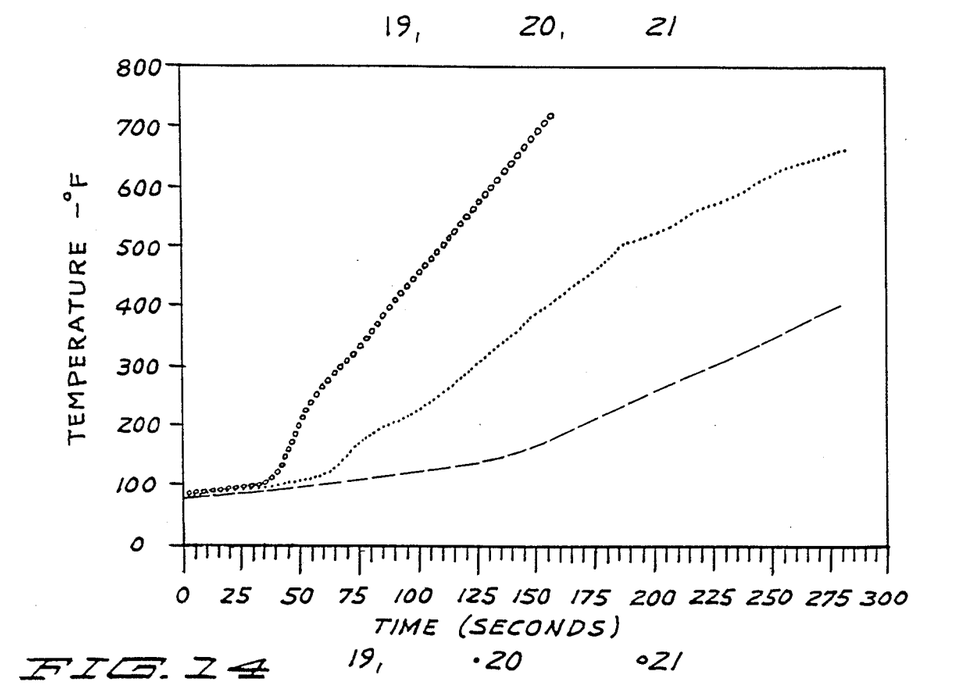

100 grams of sodium metasilicate pentahydrate was mixed with 30 grams of calcium sulfate hemihydrate, 40 grams of Hawthorn Bonding Fireclay and 40 grams of A. P. Green Fireclay. After blending to a uniform mix, 60 grams of distilled water was added containing 7.5 grams of titanium dioxide (rutile) M.W. 79.90. The resulting mix was plastic and easily workable. The mass was cast into 3.5 inch square tiles 0.125 inches thick and a paper backing was bonded to the surface. The composite susceptor was dried for 1 hour at 180° F. (82.2° C.). The resulting tiles were intact and displayed 5% shrinkage upon drying. The susceptor weight was 42.6 grams, density 1.897 g cm$^{-3}$. The recorded and averaged temperature profile of the susceptor is shown in FIG. 14 as line 19. The metal salt in this example is acting as a dampener on the susceptor.

EXAMPLE 20

Similar to Example 19 except with 7.5 grams of sodium chloride M.W. 58.44 substituted for the 7.5 grams of titanium dioxide (rutile). The structure weight was 42.0 grams, density 1.868 g cm$^{-3}$, thickness 0.125 inches. The recorded and averaged temperature of the susceptor during the microwave exposure is shown in FIG. 14 as line 20. The metal salt in this example is acting as an accelerator on the susceptor.

EXAMPLE 21

Similar to Example 19 except with 7.5 grams of sodium oxalate M.W. 134.00 substituted for the 7.5 grams of titanium dioxide (rutile). The structure weight was 39.4 grams, density 1.753 g cm$^{-3}$, thickness 0.125 inches. The recorded and averaged temperature of the susceptor during the microwave exposure is shown in FIG. 14 as line 21. The metal salt in this example is acting as a super accelerator on the susceptor.

EXAMPLE 22

Figure 15:
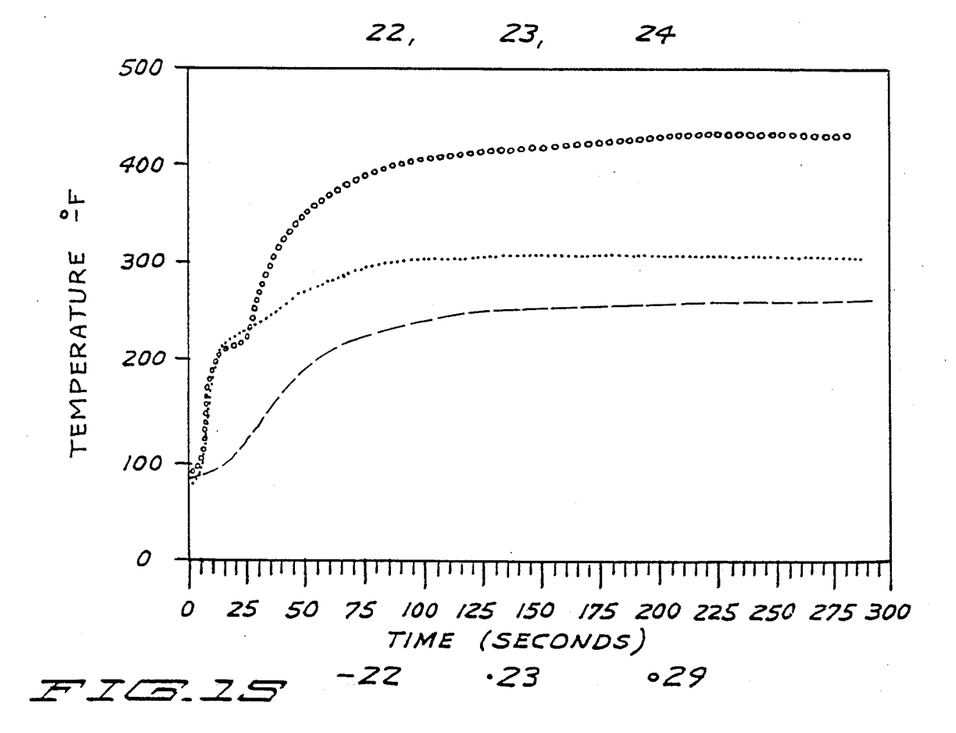

5.0 grams of sodium metasilicate, 30 grams calcium sulfate hemihydrate, 15 grams of calcined activated high alumina X-5111 (Englehard Corporation), 80 grams of Tennessee Clay #6 (Kentucky-Tennessee Clay Company, Mayfield, KY) and 7.5 grams of Hawthorn Bonding Fireclay (Minnesota Clay, Bloomington, MN) were dry blended together to a uniform consistency. 70 grams of distilled water containing 7.5 grams of boron oxide M.W. 69.62 was added to the dry powder mix and a paste formed upon mixing. The paste was cast into 3.5 inch square tiles 0.125 inches thick and a paper backing was bonded to the surface. The composite susceptor was dried for 2 hours at 170° F. (76.7° C.). The resulting tiles were intact and displayed less than 2% shrinkage upon drying. The susceptor weight was 31.7 grams, density 1.263 g cm$^{-3}$. The recorded and averaged temperature profile of the susceptor is shown in FIG. 15 as line 22. The metal salt in this example is acting as a dampener on the susceptor.

EXAMPLE 23

Similar to Example 22 except with 7.5 grams of sodium chloride M.W. 58.44 substituted for the 7.5 grams of boron oxide. The structure weight was 29.2 grams, density 1.163 g cm$^{-3}$, thickness 0.125 inches. The recorded and averaged temperature of the susceptor during the microwave exposure is shown in FIG. 15 as line 23. The metal salt in this example is acting as an accelerator on the susceptor.

EXAMPLE 24

Similar to Example 22 except with 7.5 grams of lithium chloride M.W. 42.39 substituted for the 7.5 grams of boron oxide. The structure weight was 33.9 grams, density 1.350 g cm$^{-3}$, thickness 0.125 inches. The recorded and averaged temperature of the susceptor during the microwave exposure is shown in FIG. 15 as line 24. The metal salt in this example is acting as a super accelerator on the susceptor.

EXAMPLE 25

Figure 16:
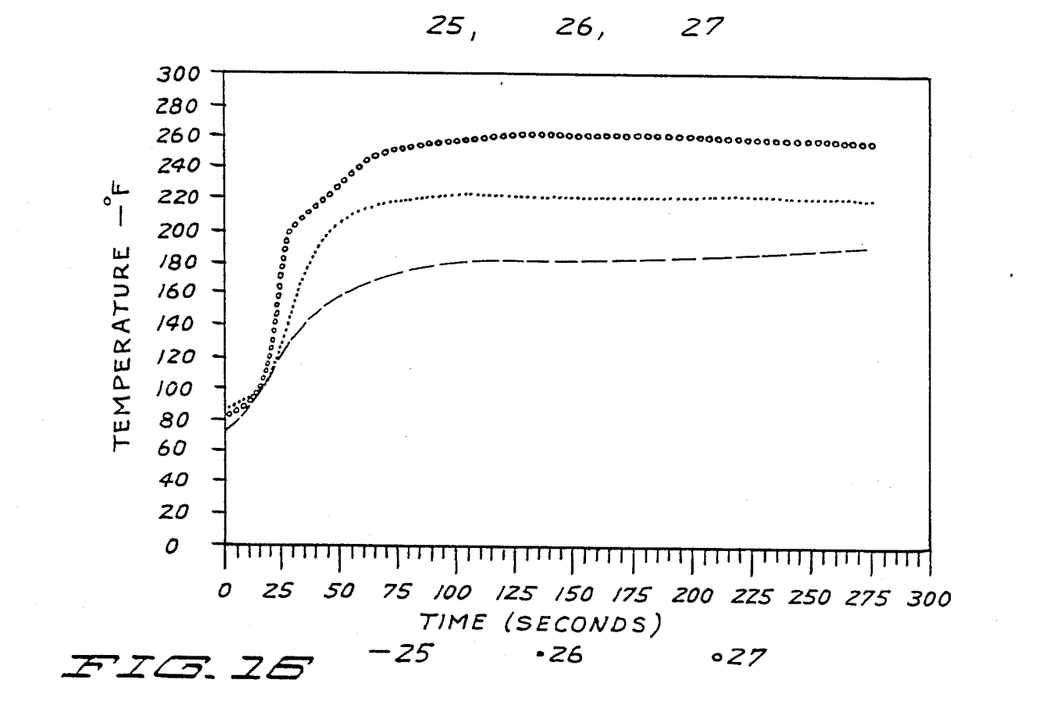

Similar to Example 22 except that the sample thickness was 0.0625 inches and major surfaces 3.5 by 3.5 inches. The structure weight was 14.2 grams, density 1.132 g cm$^{-3}$. The recorded and averaged temperature of the susceptor during the microwave exposure is shown in FIG. 16 as line 25.

EXAMPLE 26

Similar to Example 22 except that the sample thickness was 0.0937 inches and major surfaces 3.5 by 3.5 inches. The structure weight was 25.3 grams, density 1.345 cm$^{-3}$. The recorded and averaged temperature of the susceptor during the microwave exposure is shown in FIG. 16 as line 26.

EXAMPLE 27

Similar to Example 22 except that the sample thickness was 0.156 inches and major surfaces 3.5 by 3.5 inches. The structure weight was 39.2 grams, density 1.252 cm$^{-3}$. The recorded and averaged temperature of the susceptor during the microwave exposure is shown in FIG. 16 as line 27.

EXAMPLE 28

Figure 17:
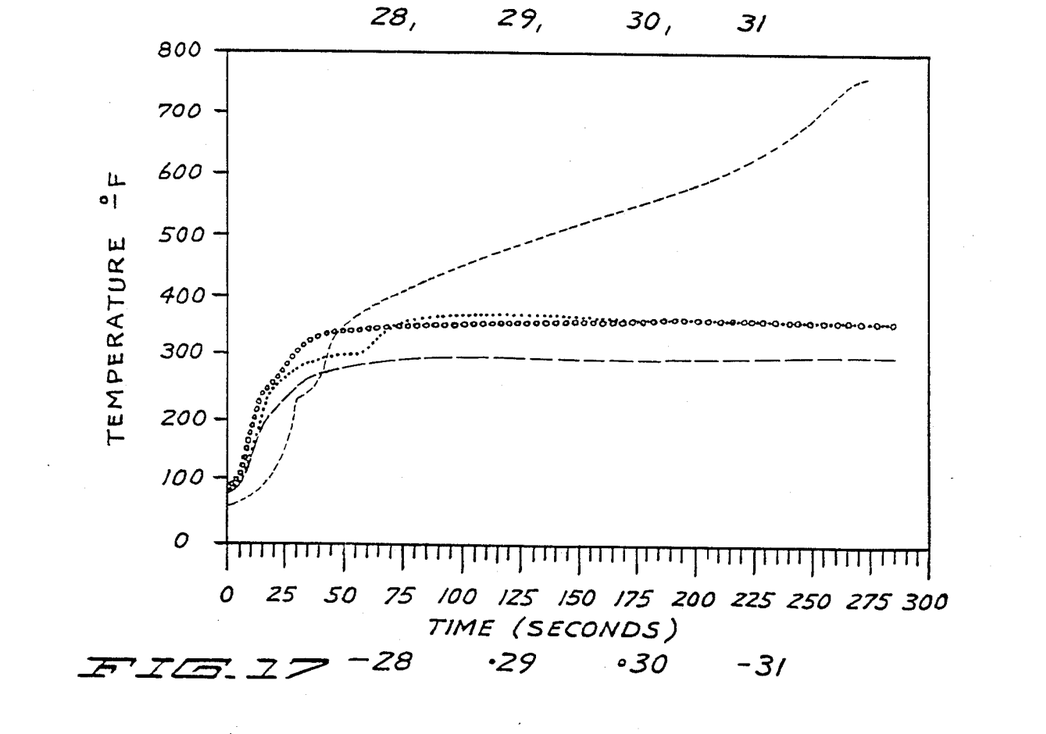

Similar to Example 24 except that the sample thickness was 0.0625 inches and major surfaces 3.5 by 3.5 inches. The structure weight was 13.3 grams, density 1.060 g cm$^{-3}$. The recorded and averaged temperature of the susceptor during the microwave exposure is shown in FIG. 17 as line 28.

EXAMPLE 29

Similar to Example 24 except that the sample thickness was 0.0937 inches and major surfaces 3.5 by 3.5 inches. The structure weight was 22.5 grams, density 1.199 g cm$^{-3}$. The recorded and averaged temperature of the susceptor during the microwave exposure is shown in FIG. 17 as line 29.

EXAMPLE 30

Similar to Example 24 except that the sample thickness was 0.125 inches and major surfaces 3.5 by 3.5 inches. The structure weight was 27.3 grams, density 1.088 g cm$^{-3}$. The recorded and averaged temperature of the susceptor during the microwave exposure is shown in FIG. 17 as line 30.

EXAMPLE 31

Similar to Example 24 except that the sample thickness was 0.118 inches and major surfaces 3.5 by 3.5 inches. The structure was compressed to a density of 1.676 g cm$^{-3}$ to remove as much void volume as possible. The recorded and averaged temperature of the susceptor during the microwave exposure is shown in FIG. 17 as line 31.

Examples 25–30 demonstrate the ability to control the temperature of the susceptor through susceptor thickness. These examples also demonstrate that the effect of thickness is common to salts whether they are dampeners, accelerators or super accelerators. Example 31 demonstrates the effect of densification of any susceptor to increase its heating ability in a microwave field.

What is claimed is:

1. An article for use as a microwave heating susceptor in a microwave radiation field which article will absorb microwave radiation to produce heat and to raise the temperature of the article, comprising:
a microwave absorptive body, said body fabricated from a ceramic composition comprising
(a) a ceramic binder,
(b) a ceramic susceptor material which absorbs microwave energy and having a neutral lattice charge, and
(c) a metal salt temperature profile moderator and wherein the ceramic composition is unvitrified.

2. The article of claim 1 wherein the binder comprises about 2% to 99.9% by weight of the composition and wherein the ceramic susceptor material comprises about 0.1% to 98% of the composition, and wherein said body having a thickness ranging from about 0.3 to 8 mm.

3. The article of claim 2 wherein the ceramic susceptor material is selected from the group consisting of sodium metasilicate, talc, kaolin, calcined alumina, alumina or activated alumina, clay, aluminosilicates, sodium aluminosilicates and mixtures thereof and wherein the metal salt temperature profile moderator comprises about 0.1% to 10% of the ceramic composition.

4. The article of claim 2 wherein the binder is selected from the group consisting of calcium sulphate, cements, calcite, silica fiber, whether amorphorus or crystalline, dolomite, aragonite, feldspar, pulverized polyamide fibers, colloidal silicas, fumed silicas, fiberglass, wood pulp, cotton fibers, thermoplastic resins and thermosetting resins.

5. The article of claim 4 wherein the ceramic susceptor material is a clay and wherein the temperature profile moderator is an accelerator.

6. The article of claim 5 wherein the ceramic susceptor material is a sodium metasilicate.

7. The article of claim 5 wherein the ceramic susceptor material is a calcined alumina, alumina or activated alumina.

8. The article of claim 1, 2, 3, 4, 5, 6 or 7 wherein the binder is a thermoplastic resin.

9. The article of claim 1, 2, 3, 4, 5, 6, or 7 wherein the ceramic composition comprises about 0.1% to 6% of the metal salt temperature profile moderator.

10. The article of claim 1, 2, 3, 4, or 6 wherein the body is in sheet form.

11. The article of claim 1, 2, 3, 4, or 6 wherein the body additionally comprises a hydro or oleophobic sealant layer.

12. The article of claim 1, 2, 3, 4, 5, 6, or 7 wherein the body is fabricated from a compressed extruded or cast ceramic composition.

13. The article of claim 1, 2, 3, 4, 6, or 7 wherein the body additionally comprises an underlying microwave shield layer.

14. The article of claim 1, 2, 3, 4, 5, 6 or 7 wherein the body is in the form of a tray.

* * * * *